United States Patent
Basker et al.

(10) Patent No.: US 10,347,765 B2
(45) Date of Patent: *Jul. 9, 2019

(54) SPLIT FIN FIELD EFFECT TRANSISTOR ENABLING BACK BIAS ON FIN TYPE FIELD EFFECT TRANSISTORS

(71) Applicant: INTERNATIONAL BUSINESS MACHINES CORPORATION, Armonk, NY (US)

(72) Inventors: Veeraraghavan S. Basker, Schenectady, NY (US); Zuoguang Liu, Schenectady, NY (US); Xin Miao, Guilderland, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/847,169

(22) Filed: Dec. 19, 2017

(65) Prior Publication Data

US 2018/0108772 A1   Apr. 19, 2018

Related U.S. Application Data

(60) Continuation of application No. 15/592,880, filed on May 11, 2017, now Pat. No. 9,899,524, which is a division of application No. 15/147,245, filed on May 5, 2016, now Pat. No. 9,806,155.

(51) Int. Cl.
*H01L 29/06* (2006.01)
*H01L 27/088* (2006.01)
(Continued)

(52) U.S. Cl.
CPC ........ *H01L 29/785* (2013.01); *H01L 21/3081* (2013.01); *H01L 21/32051* (2013.01);
(Continued)

(58) Field of Classification Search
None
See application file for complete search history.

(56) References Cited

U.S. PATENT DOCUMENTS 6,465,836 B2   10/2002   Lin et al.
7,091,566 B2   8/2006   Zhu et al.
(Continued)

OTHER PUBLICATIONS

List of IBM Patents or Patent Applications Treated as Related dated Dec. 19, 2017, 2 pages.
(Continued)

*Primary Examiner* — Raj R Gupta
(74) *Attorney, Agent, or Firm* — Tutujian & Bitetto, P.C.; Vazken Alexanian

(57) ABSTRACT

A method of forming the semiconductor device that may include forming a trench in a substrate, and forming a metal nitride in the trench. The method may further include forming a split fin structure from the substrate. The metal nitride is positioned in the split portion of the fin structure. The method may continue with removing the metal nitride from a source region and drain region portion of the split fin structure, in which the metal nitride remains in a channel region portion of the split fin structure. A gate structure may then be formed on a channel region portion of the fin structure. A back bias is applied to the semiconductor device using the metal nitride in the split portion of the fin structure as an electrode.

20 Claims, 15 Drawing Sheets

(51) Int. Cl.

| | | |
|---|---|---|
| *H01L 29/66* | (2006.01) | |
| *H01L 29/78* | (2006.01) | |
| *H01L 29/10* | (2006.01) | |
| *H01L 21/308* | (2006.01) | |
| *H01L 21/3205* | (2006.01) | |
| *H01L 21/8234* | (2006.01) | |
| *H01L 29/417* | (2006.01) | |
| *H01L 29/08* | (2006.01) | |
| *H01L 29/51* | (2006.01) | |
| *H01L 21/311* | (2006.01) | |
| *H01L 21/3065* | (2006.01) | |
| *H01L 29/36* | (2006.01) | |

(52) U.S. Cl.
CPC ........... *H01L 21/823431* (2013.01); *H01L 21/823481* (2013.01); *H01L 27/0886* (2013.01); *H01L 29/0653* (2013.01); *H01L 29/0847* (2013.01); *H01L 29/1087* (2013.01); *H01L 29/41791* (2013.01); *H01L 29/66545* (2013.01); *H01L 29/66795* (2013.01); *H01L 21/3065* (2013.01); *H01L 21/31116* (2013.01); *H01L 29/36* (2013.01); *H01L 29/517* (2013.01)

(56) References Cited

U.S. PATENT DOCUMENTS

| | | | |
|---|---|---|---|
| 7,205,601 B2 | 4/2007 | Lee et al. | |
| 7,259,420 B2 | 8/2007 | Anderson et al. | |
| 7,681,628 B2 | 3/2010 | Joshi et al. | |
| 7,692,250 B2 | 4/2010 | Booth, Jr. et al. | |
| 7,888,192 B2 | 2/2011 | Marshall et al. | |
| 9,899,524 B2 * | 2/2018 | Basker | H01L 29/1087 |
| 2007/0242497 A1 | 10/2007 | Joshi et al. | |
| 2009/0108351 A1 | 4/2009 | Yang et al. | |
| 2016/0104801 A1 * | 4/2016 | Zhu | H01L 29/66795 365/185.25 |

OTHER PUBLICATIONS

Koo, J.M. et al., "Vertical Structure NAND Flash Array Integration with Paired FinFET Multi-bit Scheme for High-density NAND Flash Memory Application", IEEE 2008 Symposium on VLSI Technology Digest of Technical Papers (2008) pp. 120-121.

Maly, W. et al., "Twin Gate, Vertical Slit FET (VeSFET) for Highly Periodic Layout and 3D integration" 18th International Conference: Mixed Design of Integrated Circuits and Systems (Jun. 2011) pp. 145-150.

* cited by examiner

SPLIT FIN FIELD EFFECT TRANSISTOR ENABLING BACK BIAS ON FIN TYPE FIELD EFFECT TRANSISTORS

BACKGROUND

Technical Field

The present disclosure relates to semiconductor devices, such as semiconductor devices including fin structures. The present disclosure further relates to processing of fin including structures that include punch through stop regions.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one aspect, a method of forming a semiconductor device is provided including a split portion fin structure and a metal nitride present centrally within the split portion of the fin structure to apply a back bias to the semiconductor device. In one embodiment, the method includes forming a trench in a substrate, and forming a metal nitride in the trench. The method may further include forming a split fin structure from the substrate. The metal nitride is positioned in the split portion of the fin structure. The method may continue with removing the metal nitride from a source region and drain region portion of the split fin structure, in which the metal nitride remains in a channel region portion of the split fin structure. A gate structure may then be formed on a channel region portion of the fin structure.

In another embodiment, the method of forming the semiconductor device may include forming a trench in a substrate, and forming a metal nitride in the trench. The method may further include forming a split fin structure from the substrate. The metal nitride is positioned in the split portion of the fin structure. The method may continue with removing the metal nitride from a source region and drain region portion of the split fin structure, in which the metal nitride remains in a channel region portion of the split fin structure. A gate structure may then be formed on a channel region portion of the fin structure. A back bias is applied to the semiconductor device using the metal nitride in the split portion of the fin structure as an electrode.

In another aspect of the present disclosure, a semiconductor device is provided including a metal nitride present centrally within a split portion of a channel region portion of a fin structure to apply a back bias to the semiconductor device. In one embodiment, the semiconductor device includes a fin structure comprising a split portion, and a metal nitride positioned in the split portion of a channel region of the fin structure. The semiconductor device may further include a source region including a first end of the split portion of the fin structure that does not include the metal nitride; and a drain region including a second end of the split portion of the fin structure that does not include the metal nitride. The first end and the second end of the split portion are on opposing sides of the channel region. A gate structure is present on the channel region of the fin structure.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
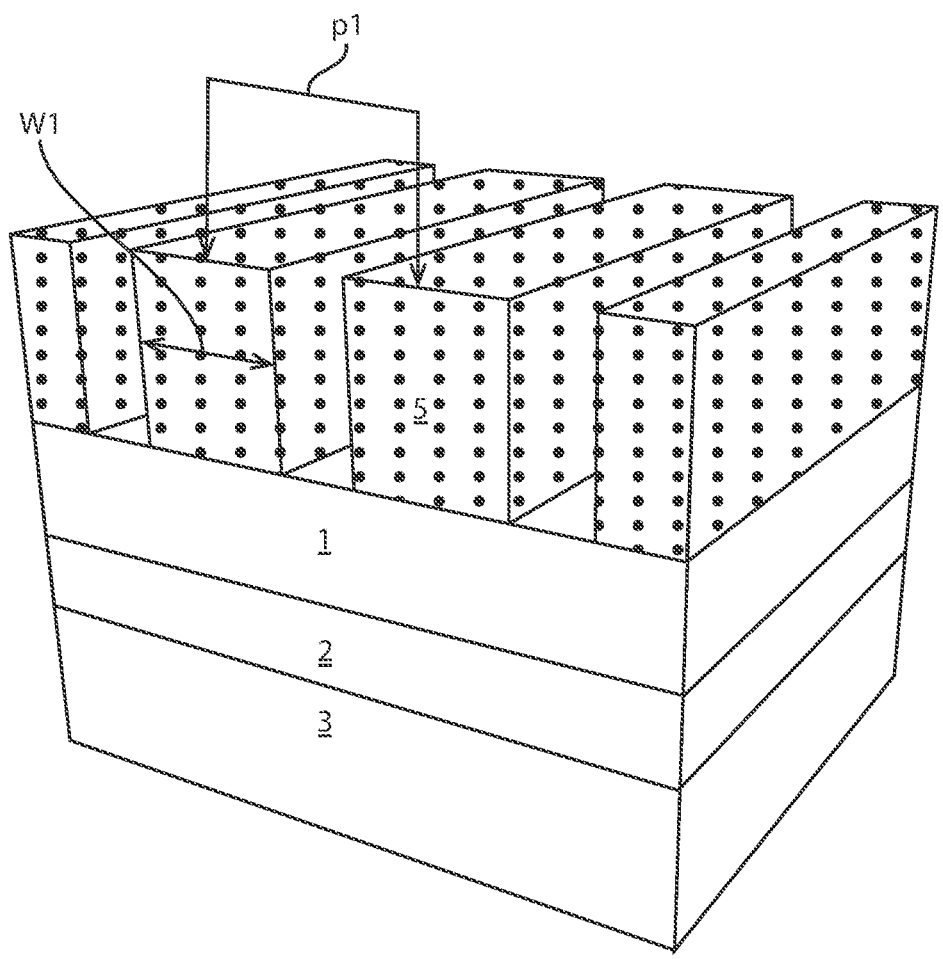
FIG. 1 is a perspective view of one embodiment of a forming a mandrel atop a substrate that is processed to provide fin structures, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET semiconductor device including a punch through stop region. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure. The source and drain regions of the fin structure are the portions of the fin structure that are on opposing sides of the channel region of the fin structure.

It has been determined that back bias can be useful in device performance, such as high performance FinFET device performance. Traditionally, planar semiconductor devices have been able to take advantage of back biasing the device in conjunction with being formed on semiconductor on insulator (SOI) substrates. However, it has been difficult to apply back bias to Fin type Field Effect Transistors (FinFETs). It has been determined that with typical FinFETs that back biasing a fin structure at the base of the fin that contacts the supporting substrate does not effectively bias the entire channel portion of the fin, i.e., the fin has a height that is too great to be effectively biased using back bias applied from an underlying substrate. Typically, the top to middle portions of the fin are inadequately back biased using conventional methods. As will be further described below, the methods and structures disclosed herein enables effective back bias in fin structures through the entire channel, i.e., effective back bias of an entire height of the channel region in the fin structures, which is suitable for use with fin structures on bulk semiconductor substrate and semiconductor on insulator (SOI) substrates. The methods and structures of the present disclosure are now described with greater detail referring to FIGS. 1-13.

FIG. 1 illustrates one embodiment of a forming a mandrel 5 atop a substrate 1 that is processed to provide fin structures. In the embodiment, the semiconductor substrate 1 is composed of intrinsic semiconductor material, i.e., not an n-type or p-type doped material. In some embodiments, the semiconductor substrate 1 may be composed of a type IV or type III-V semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. A compound semiconductor may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the fin structures 10 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The semiconductor substrate 1 may be a bulk substrate, as depicted in FIG. 1, or the semiconductor substrate may be a semiconductor on insulator (SOI) substrate. The substrate 1 may have a dopant region 2 (e.g. punch through stopper). The punch through stopper has n-type dopant for PFET, or has p-type dopant for NFET. The dopant region 2 can be for the back bias contact, which is composed of an n-type or p-type dopant that may be implanted into the substrate 1. The term "conductivity type" denotes whether are region of the device is doped to an n-type or p-type conductivity. As used herein, "p-type" refers to the addition of impurities to an intrinsic semiconductor that creates deficiencies of valence electrons. In a type IV semiconductor, such as a silicon-containing semiconductor material, examples of n-type dopants, i.e., impurities, include but are not limited to: boron, aluminum, gallium and indium. As used herein, "n-type" refers to the addition of impurities that contributes free electrons to an intrinsic semiconductor. In a type IV semiconductor, such as a silicon containing semiconductor material, examples of n-type dopants, i.e., impurities, include but are not limited to antimony, arsenic and phosphorous. The dopant region 2 may be formed using ion implantation. The substrate 1 could also have a well region 3 that has the same type of dopant with the dopant region 2 but less dopant concentration than that of the dopant region 2. In one example, the dopant region 2 could have dopant concentration $2 \times 10^{18}$ cm$^{-3}$ to $1 \times 10^{19}$ cm$^{-3}$, while the well region 3 could have be un-doped to dopant concentration $1 \times 10^{18}$ cm$^{-3}$. An SOI substrate typically includes an upper semiconductor layer, which may be referred to as an SOI layer; a dielectric layer underlying the upper semiconductor layer, which may be referred to as a buried oxide layer (BOX); and a base substrate (also referred to as supporting substrate) of a semiconductor material underlying the dielectric layer.

Forming the mandrels 5 atop the semiconductor substrate can include forming a mandrel material layer on the material layer of the semiconductor substrate 1 that provides the fin structures. The mandrel material layer can include any material (semiconductor, dielectric or conductive) that can be selectively removed from the structure during a subsequently performed etching process. In one embodiment, the mandrel material layer 5 may be composed of amorphous silicon or polysilicon. In another embodiment, the mandrel material layer 5 may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures 5 on the topmost surface of the semiconductor substrate 1.

The mandrels 5 may have a width W1 ranging from 10 nm to 60 nm. In some embodiments, the mandrels 5 may have a width W2 ranging from 15 nm to 50 nm. The term "pitch" denotes the center to center distance separating adjacent structures, e.g., repeating adjacent structures. In the embodiment that is depicted in FIG. 1, the mandrels may be separated by a pitch P1 ranging from 30 nm to 80 nm. In another embodiment, the mandrels may be separated by a pitch P1 ranging from 35 nm to 70 nm.

Figure 2:
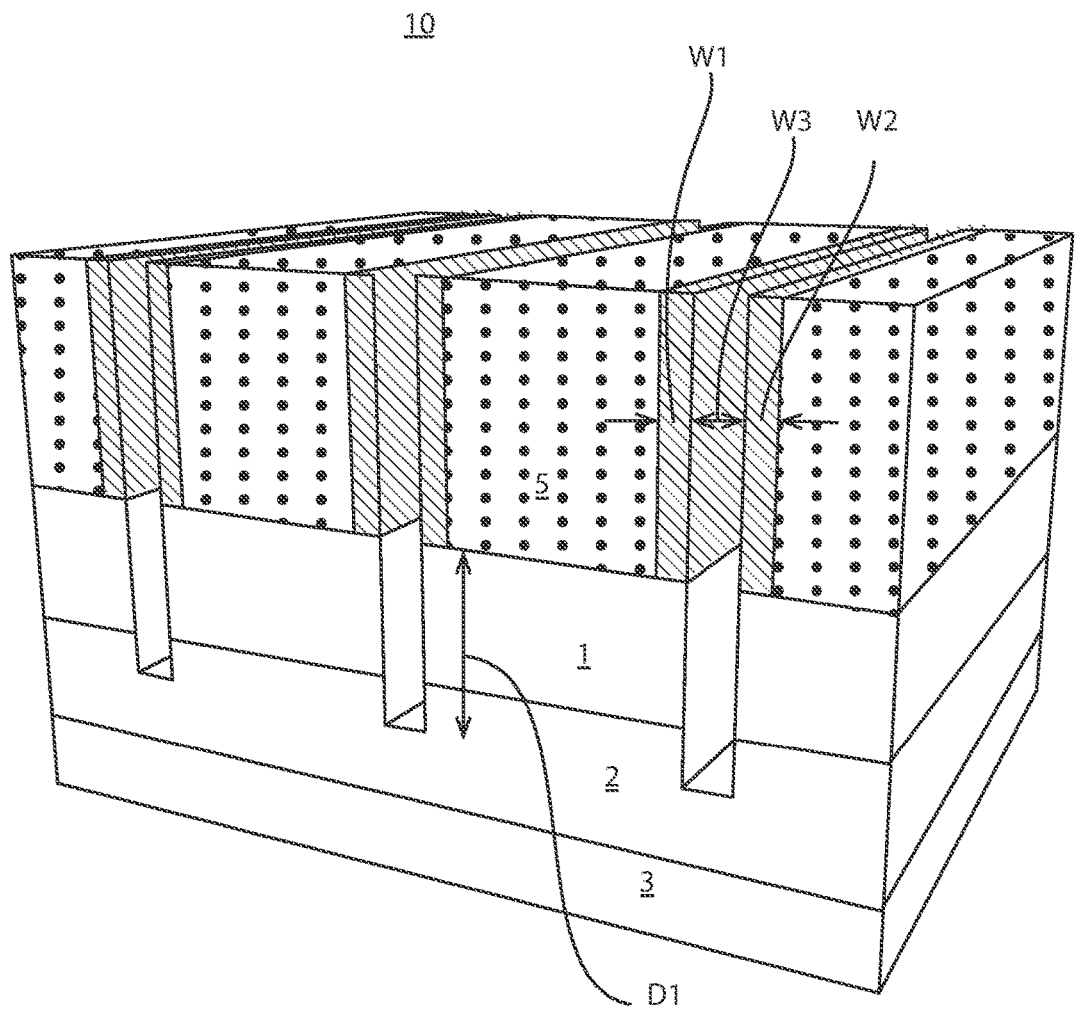
FIG. 2 is a perspective view of forming spacers on the sidewalls of the mandrels and etching the substrate using a combination of the spacers and the mandrels as an etch mask, in accordance with one embodiment of the present disclosure.

FIG. 2 depicts one embodiment of forming spacers 10 on the sidewalls of the mandrels 5 and etching the substrate 5 using a combination of the spacers 10 and the mandrels as an etch mask. The spacers 10 may be formed by deposition of a dielectric spacer material, and then etching the deposited dielectric spacer material. The dielectric spacer material may comprise any dielectric spacer material such as, for example, silicon dioxide, silicon nitride or a dielectric metal oxide. In one example, the dielectric spacer material is silicon nitride. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers 10 include any etching process, such as, e.g., reactive ion etching (RIE). The spacers 10 may have a width W2 ranging from 1 nm to 10 nm. For example, the spacers 10 may have a width W2 on the order of 5 nm.

Still referring to FIG. 2, following formation of the spacers 10, a trench 15 may be formed in the semiconductor substrate 1 with an etch process that employs the spacers 10 and the mandrels 5 as an etch mask. In some embodiments, the bottom of the trench 15 reaches or is inside the dopant region 2 (e.g. punch through stopper region). The etch process for forming the trench 15 may be an anisotropic etch, such as reactive ion etch (RIE). Other etch processes that are suitable for this stage of the present disclosure may include gas plasma etching and laser etching. In some embodiments, the etch process for etching the trench 10 is selective to the mandrels 5 and the spacers 10. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a material of the semiconductor substrate 1 selectively to the mandrels 5 and spacers 10 by a ratio of 10:1 or greater, e.g., 100:1 or greater.

The trench 10 may have a width W3 ranging from 5 nm to 20 nm, and a depth D1 ranging from 30 nm to 100 nm. In one example, the trench 10 has a width of approximately 10 nm and a depth D1 of approximately 50 nm.

Figure 3:
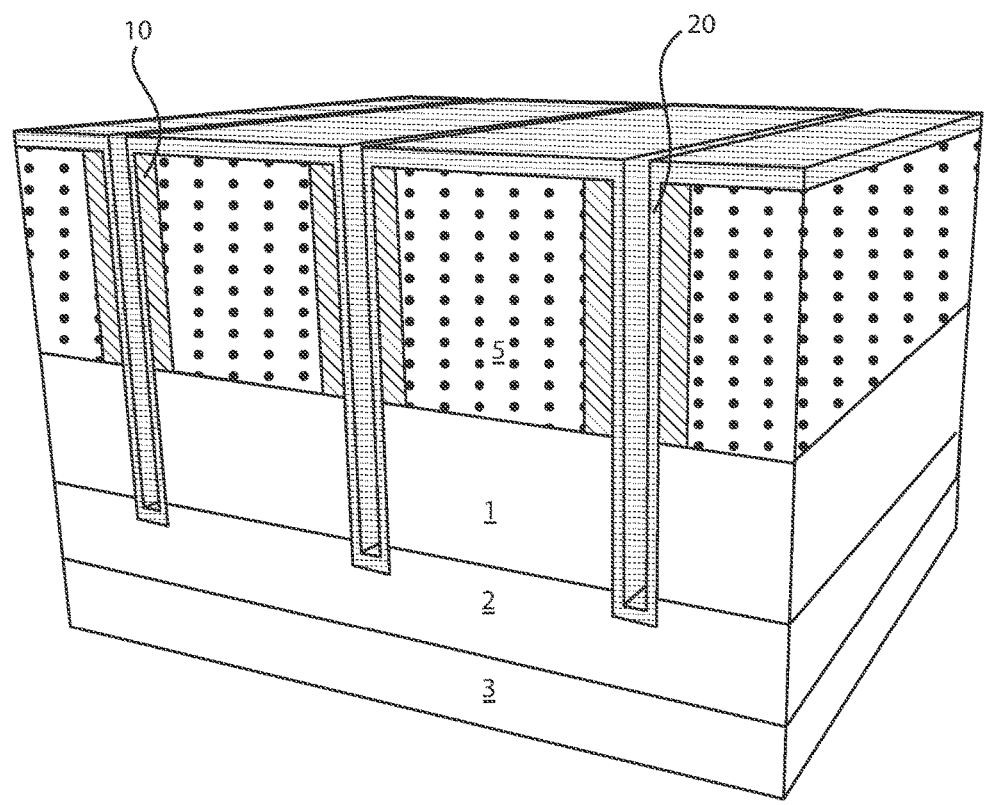
FIG. 3 is a perspective view of depicting forming a high-k dielectric layer on at least the sidewalls of the trench and forming a dopant region for back bias contact at the base of the trench, in accordance with one embodiment of the present disclosure.

FIG. 3 depicts one embodiment of forming a high-k dielectric layer 20 on the sidewalls of the trench 15 and using the dopant region 2 for back bias contact at the base of the trench 15. The term "high-k" denotes a dielectric material having a dielectric constant greater than silicon oxide ($SiO_2$) at room temperature (20° C. to 25° C.) and atmospheric pressure (1 atm). For example, a high-k dielectric layer 20 may have a dielectric constant greater than 4.0. In another example, the high-k gate dielectric layer 20 has a dielectric constant greater than 7.0. In one embodiment, the high-k gate dielectric layer 20 may be composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the high-k gate dielectric layer 20 include hafnium silicate, hafnium silicon oxynitride or combinations thereof.

The high-k dielectric layer 20 is typically a conformally formed layer that is formed on the sidewalls of the trench 15 provided by the etched portion of the substrate 1 and the sidewalls of the spacers 10. These portions of the conformally formed high-k dielectric layer 20 may be referred to as vertically orientated portions. The high-k dielectric layer 20 is also formed on the base of the trench 15, as well as the upper surfaces of the spacers 20 and the mandrels 5. These portions of the conformally formed high-k dielectric layer 20 may be referred to as laterally orientated portions. The vertically orientated portions and laterally orientated portions of the high-k dielectric layer 20 may be provided by a continuous layer. The term "conformal" denotes a layer having a thickness that does not deviate from greater than or less than 30% of an average value for the thickness of the layer. In one embodiment, the high-k gate dielectric layer 20 may be deposited by chemical vapor deposition (CVD). Variations of CVD processes suitable for depositing the high-k dielectric layer 20 include, but are not limited to, atomic pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD), and combinations thereof. In one embodiment, the thickness of the high-k dielectric layer 20 is greater than 0.8 nm. More typically, the high-k dielectric layer 20 has a thickness ranging from about 1.0 nm to about 6.0 nm.

Figure 4:
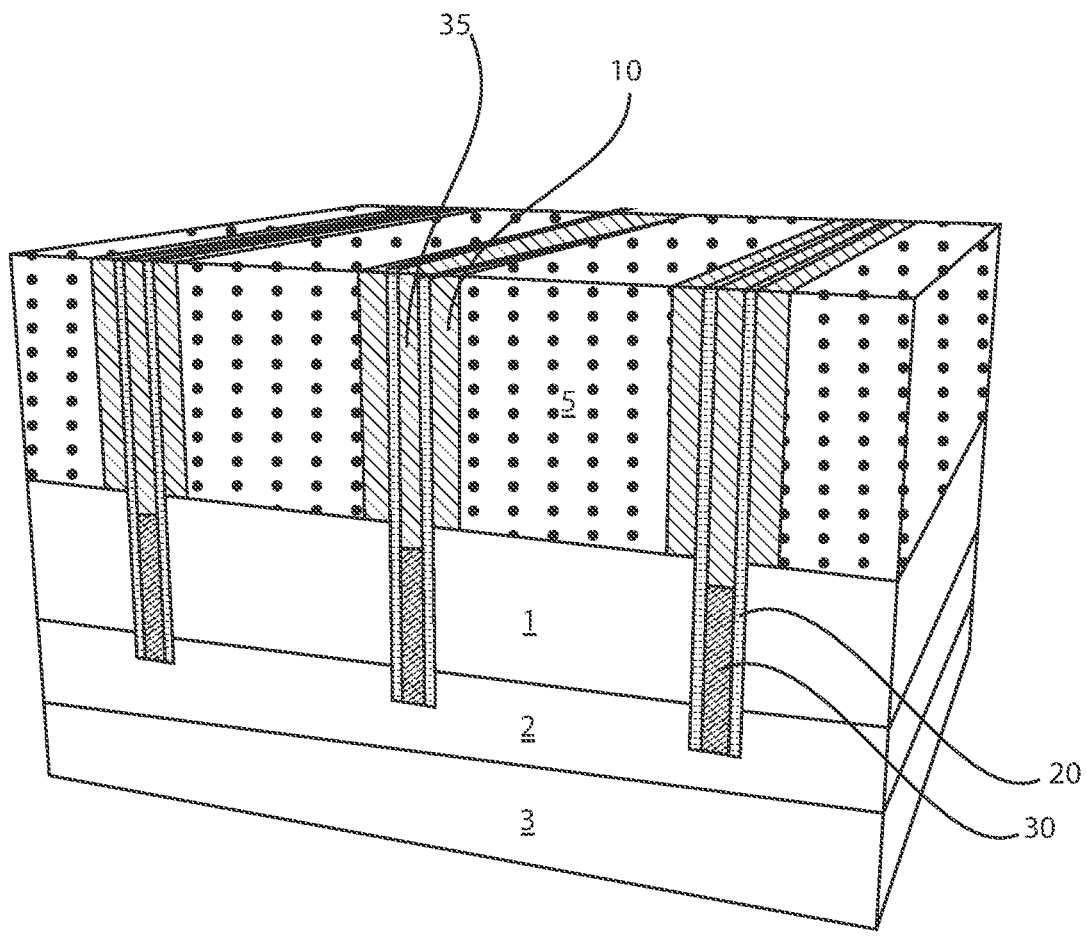
FIG. 4 is a perspective view of one embodiment of removing the horizontal portions of the high-k dielectric layer, forming a metal nitride layer in a lower portion of the trench, and filling the upper portion of the trench with a dielectric cap, in accordance with one embodiment of the present disclosure.

FIG. 4 depicts one embodiment of removing the horizontal portions of the high-k dielectric layer 20, forming a metal nitride layer 30 in a lower portion of the trench 15, and filling the upper portion of the trench with a dielectric cap 35. Removing the horizontal portions of the high-k dielectric layer 20 may include an etch process, such as gas cluster ion beam (GCIB) etching. It is noted that this is only one example of an etch process that can be used at this step of the process flow. The etch process for removing the horizontal portions of the high-k dielectric layer 20 may include any wet or dry etch. In some embodiments, the etch process may be selective to the mandrel 5 and the semiconductor substrate 1. In some examples, the etch process may be an anisotropic etch. For example, alternative etch processes that can be used at this stage of the process flow can include reactive ion etch, plasma etch, laser etching, laser ablation, and combinations thereof.

In a following process step, the metal nitride 30 may be deposited at least filling a portion of the trench 15. For example, the metal nitride 30 may be provided by titanium nitride (TiN). Other examples of metal nitrides 30 that can be used at this stage of the present disclosure may include tantalum nitride (TaN), tungsten nitride (WN), tantalum silicon nitride (TaSiN) and combinations thereof. In other embodiment, the metal nitride 30 may be substituted with an elemental metal layer, such as Al, Mo, W, Ta, Ti, Cu, Pt and combinations thereof. The metal nitride 30 may be blanket deposited and may completely fill the trenches 15 with a portion of the metal nitride 30 extending onto the upper surfaces of the mandrel 5 and the spacers 10. The metal nitride layer 30 may be deposited using chemical vapor deposition (CVD) or physical vapor deposition (PVD). Examples of PVD that are suitable for forming the metal nitride layer 30 include plating, electroplating, electroless plating, sputtering and combinations thereof. Examples of chemical vapor deposition (CVD) suitable for forming the metal nitride layer 30 may include metal organic chemical vapor deposition (MOCVD) or plasma enhanced chemical vapor deposition (PECVD).

In some embodiments, the metal nitride 30 may be recessed within the trench using an etch process so that the upper surface of the recessed metal nitride 30 is below an upper surface of the semiconductor substrate 1. For example, the metal nitride 30 may be recessed until the upper surface of the metal nitride 30 is below and vertically offset from the upper surface of the semiconductor substrate 1 by a dimension ranging from 1 nm to 20 nm. In another example, the metal nitride 30 may be recessed until the upper surface of the metal nitride 30 is below and vertically offset from the upper surface of the semiconductor substrate 1 by a dimension ranging from 5 nm to 10 nm. The etch process for recessing the metal nitride 30 can be selective to the mandrels 5, as well as the spacers 10. The etch process for recessing the metal nitride 30 may be a dry process or a wet process. For example, the etch process may include wet chemical etching, reactive ion etching, gas cluster ion beam (GCIB) etching or a combination thereof.

Still referring to FIG. 4, a dielectric cap 35 is formed atop the recessed metal nitride 30 filling the trench 15. The dielectric cap 35 may be composed of any dielectric material, such as an oxide, nitride or oxynitride material. In some embodiments, when the dielectric cap 35 is composed of a nitride, the nitride may be silicon nitride. The dielectric cap 35 may be deposited using a chemical vapor deposition (CVD) process. For example, the CVD process for forming the dielectric cap 35 may include atomic pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD) or a combination thereof. In some embodiments, to provide that the upper surface of the dielectric cap 35 is coplanar with the upper surface of the mandrel 5, the dielectric cap 35 may be planarized using a planarization process, such as grinding or chemical mechanical planarization.

Figure 5:
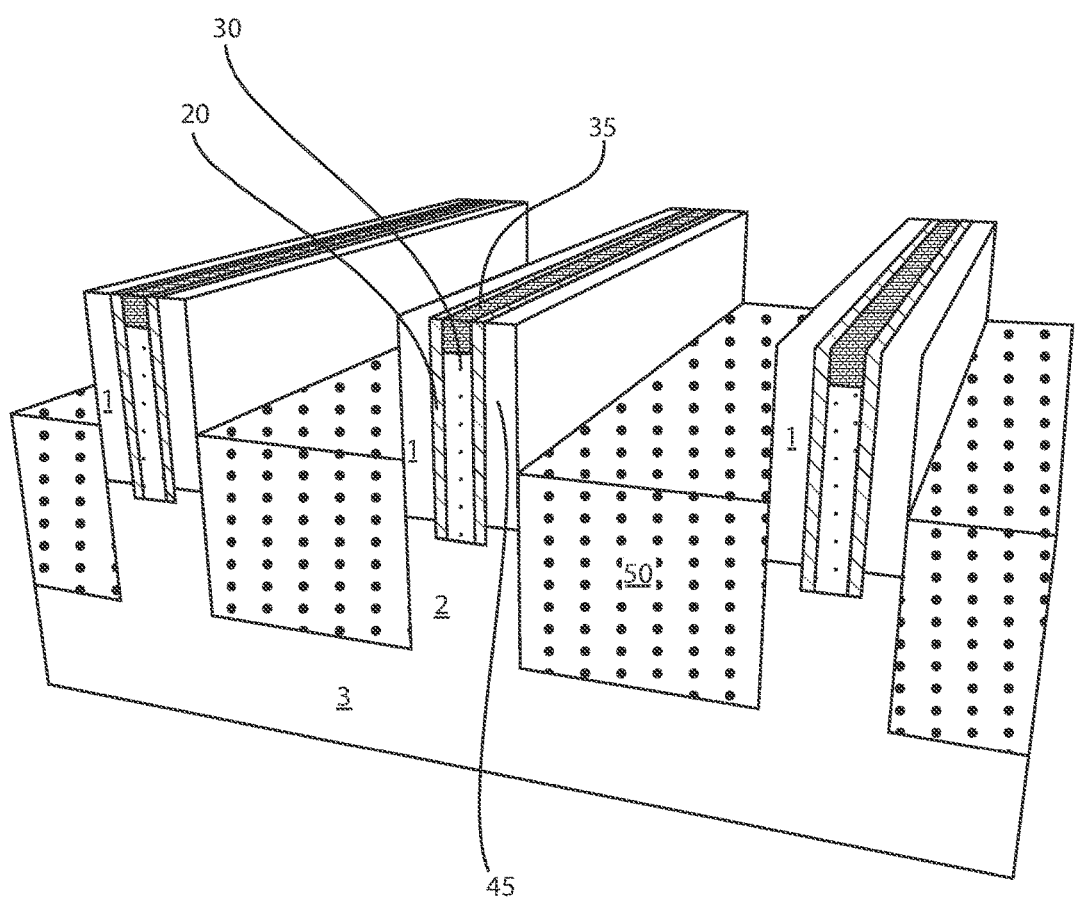
FIG. 5 is a perspective view depicting removing the mandrels, etching fin trenches in the semiconductor substrate, forming isolation regions in the fin trenches, and recessing the isolation regions and the dielectric caps, in accordance with one embodiment of the present disclosure.

FIG. 5 depicts one embodiment of a structure that is produced by a process flow that includes removing the mandrels 5; etching fin trenches 45 in the semiconductor substrate 1; forming isolation regions 50 in the fin trenches; and recessing the isolation regions 50 and the dielectric caps 35. The mandrels 5 may be removed using a selective etch process. For example, the mandrels 5 may be removed by an etch process that removes the mandrels selectively to the spacers 10, the high-k dielectric 20, and the dielectric cap 35. The etch process for removing the mandrels 5 may also be selective to the semiconductor substrate 1. The etch process for removing the mandrels 5 may be a wet etch or a dry etch. One example of a wet etch for removing the mandrels is a wet chemical etch. Dry etch process for removing the mandrels 5 may include reactive ion etch (RIE) and plasma etching.

Following removing the mandrels 5, the fin structures 45 may be patterned by etching the semiconductor substrate 1 using the spacers 10 and the dielectric cap 35 as an etch mask. The etch process for forming the fin structures 45 may be an anisotropic etch process. For example, the anisotropic etch process for forming the fin structures 45 may include reactive ion etch (RIE), plasma etching, ion beam etching or laser ablation. The etch process is continued until the semiconductor substrate 1 is etched to a depth suitable for providing the selected height of the fin structures 45. In some embodiments, the fin structures 45 may have a height ranging from 5 nm to 200 nm. In another embodiment, the fin structures 45 may have a height ranging from 10 nm to 100 nm. In one example, the fin structures 45 may have a height ranging from 20 nm to 50 nm. The fin structures 45 may have a width of less than 20 nm. In another embodiment, the fin structures 45 may have a width ranging from 3 nm to 8 nm.

As depicted in FIG. 5, each of the fin structures 45 includes an upper portion having a centrally positioned metal nitride 30. The positioning of the centrally positioned metal nitride 30 that is flanked by split upper portions of the fin structure 45 illustrate a "split" fin structure. As depicted in FIG. 5, the centrally positioned metal nitride 30 can be separated from the split portion of the fin structure 45 by portions of the high-k dielectric layer 20.

Following patterning of the semiconductor substrate 1 to provide the fin structures 45, the fin structure trenches 45 may be filled with a dielectric material for forming isolation regions 50 between adjacent fin structures 45. The dielectric material may be deposited in the fin structure trenches using deposition processes, such as chemical vapor deposition (CVD). The dielectric material may be an oxide, nitride or oxynitride material. For example, the dielectric material that is deposited in the trenches between adjacent fin structures may be composed of silicon oxide. In some embodiments, the dielectric material that is deposited for the isolation regions 50 may be deposited to a depth that entirely fills the trenches separating adjacent fin structures.

In some embodiments, the method may continue with planarizing the structure stopping on the upper surface of the fin structures 45, as depicted in FIG. 5. The planarization process may be provided by grinding or chemical mechanical planarization (CMP). The planarization step may remove the entirety of the spacers 10. A portion of the dielectric cap 35 may remain atop the metal nitride material 30. In some embodiments, at this stage of the process flow the upper surface of the dielectric material in the isolation region 50 may be coplanar with the upper surface of the fin structures 45 and the upper surface of the remaining portion of the dielectric cap 35.

In a following process step, a fin reveal etch may be conducted that recesses the dielectric material that provides the isolation regions 50. The dielectric material for the isolation regions 50 may be recessed using an etch process that removes the dielectric material for the isolation regions 50 selectively to the fin structure 45, the high-k dielectric layer 20 and the dielectric cap 35. The etch process for revealing the fin structures may be a dry process or a wet process. For example, the etch process may be anisotropic, and selected from reactive ion etch (RIE), plasma etching, laser ablation and combinations thereof. In some embodiment, the length L1 of the sidewall of the fin structures 45 revealed by this etch process may range from 15 nm to 40 nm.

Figure 6:
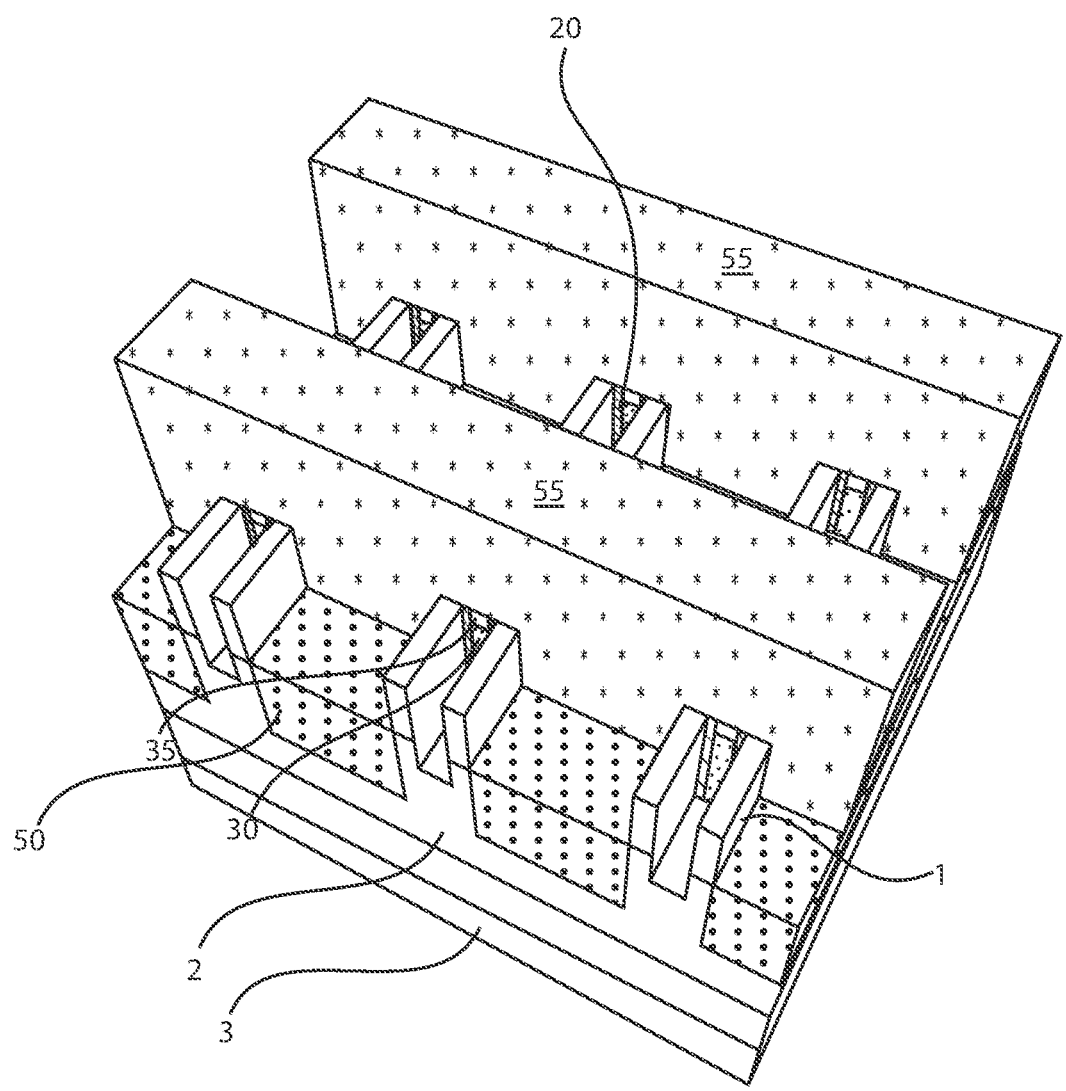
FIG. 6 is a perspective view depicting forming a sacrificial gate structure, and removing exposed portions of the dielectric caps, metal nitride layer and high-k dielectric layer, in accordance with one embodiment of the present disclosure.

FIG. 6 depicts forming a sacrificial gate structure 55, and removing exposed portions of the dielectric caps 35, metal nitride layer 30 and high-k dielectric layer 20. The term "sacrificial" as used to describe the sacrificial gate structure 55 depicted in FIG. 6 denotes that the structure is present during the process sequence, but is not present in the final device structure, in which the sacrificial gate structure 55 provides an opening that dictates the size and geometry of a later formed functional gate conductor. The sacrificial material that provides the sacrificial gate structure 55 may be composed of any material that can be etched selectively to the underlying fin structure 45 and metal nitride layer 35. In one embodiment, the sacrificial material that provides the sacrificial gate structure 55 may be composed of a silicon-containing material, such as polysilicon. Although, the sacrificial gate structure 55 is typically composed of a semiconductor material, the sacrificial gate structure 55 may also be composed of a dielectric material, such as an oxide, nitride or oxynitride material, or amorphous carbon.

The sacrificial material may be patterned and etched to provide the sacrificial gate structure 55. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the sacrificial gate structure 55, while the exposed regions are removed using a selective etching process that removes the unprotected regions. Following formation of sacrificial gate structure 55, the photoresist may be removed.

FIG. 6 also depicts one embodiment of removing the portions of the dielectric caps 35, the metal nitride layer 30 and the high-k dielectric layer 20 that correspond to the source and drain region portions of the fin structure 45. The portion of the dielectric caps 35, the metal nitride layer 30 and the high-k dielectric layer 20 that are present in the channel portion of the fin structure 45 remain and are protected by the sacrificial gate structure 55, which functions as an etch mask.

The dielectric caps 35, the metal nitride layer 30 and the high-k dielectric layer 20 that are present in the source and drain region portions of the fin structures 45 may be removed with an etch process that is selective to the fin structures 45 and the sacrificial gate structure 55. The etch process may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of etch processes that can be used at this point of the present disclosure include ion beam etching, plasma etching or laser ablation.

Figure 7:
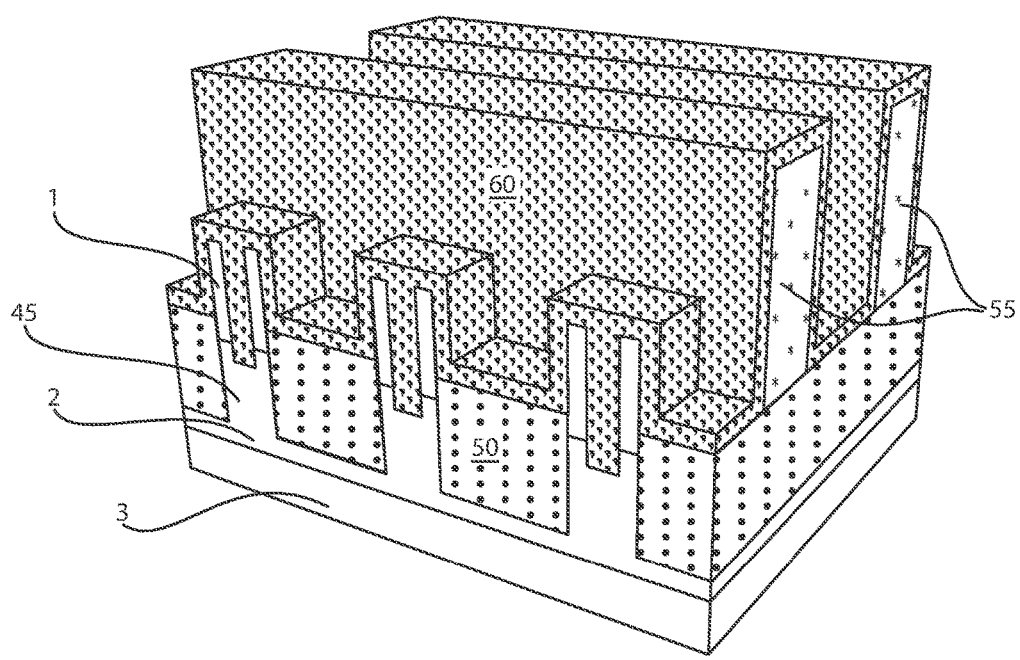
FIG. 7 is a perspective view depicting one embodiment of a blanket deposition of a low-k spacer material on the structure depicted in FIG. 6.

FIG. 7 depicts one embodiment of a blanket deposition of a low-k spacer material 60 on the structure depicted in FIG. 6. The low-k spacer material 60 can typically have a dielectric constant that is less than 4.0, e.g., 3.9. In one embodiment, the low-k spacer material 60 can have a dielectric constant ranging from 1.75 to 3.5. In another embodiment, the low-k spacer material 60 has a dielectric constant ranging from 2.0 to 3.2. In yet an even further embodiment, the low-k spacer material 60 has a dielectric constant ranging from 2.25 to 3.0. Examples of materials suitable for the low-k spacer material 60 include organosilicate glass (OSG), fluorine doped silicon dioxide, carbon doped silicon dioxide, boron doped silicon carbon nitride (SiBCN), carbon doped silicon oxynitride (SiOCN), porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The low-k spacer material 60 may be deposited using chemical vapor deposition methods, such as atomic pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD), and combinations thereof. In other embodiments, the low-k spacer material 60 may be deposited using spin on deposition.

Figure 8:
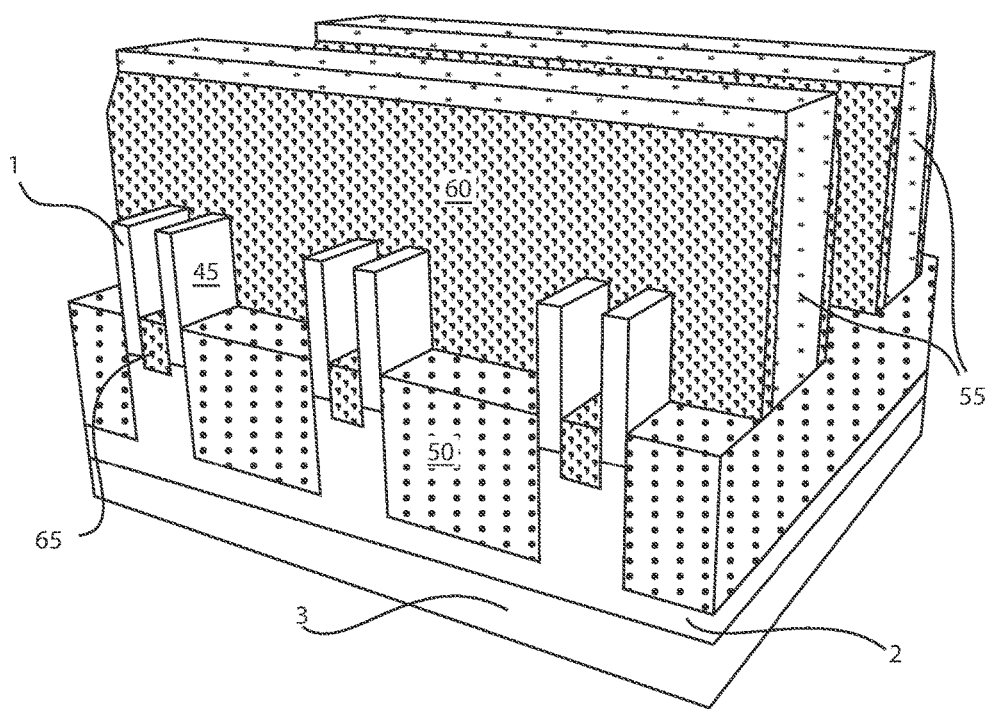
FIG. 8 is a perspective view of etching the low-k spacer material to form spacers, in accordance with one embodiment of the present disclosure.

FIG. 8 depicts one embodiment of etching the low-k spacer material 60 to form spacers 65 that are present on sidewalls of the sacrificial gate structure 55. In some embodiments, a portion of the low-k spacer material 65 remains in the space between the split portion of the fin structures 45 having an upper surface substantially coplanar with an upper surface of the isolation regions. Recessing this portions of the fins provides a fin reveal for the epitaxial growth surfaces for forming the source and drain regions. The spacers 65 may be patterned from the low-k spacer material 60 using an anisotropic etch process, such as reactive ion etch.

Figure 9:
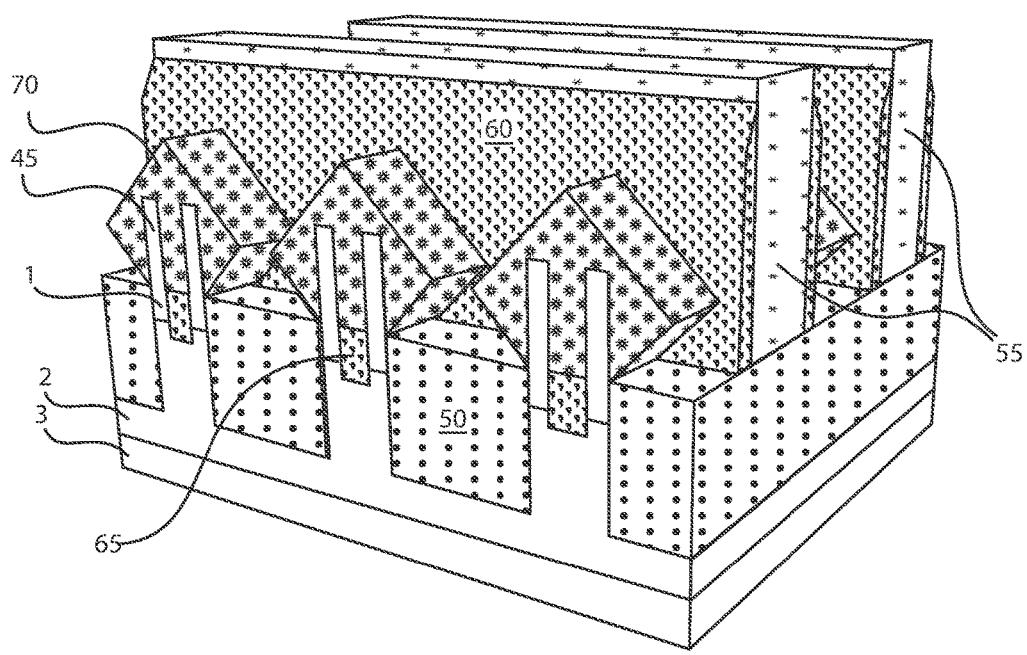
FIG. 9 is a perspective view of forming epitaxial semiconductor source and drain material, in accordance with one embodiment of the present disclosure.

FIG. 9 depicts one embodiment of forming epitaxial semiconductor source and drain material 70 on the exposed portions of the fin structures 45. The epitaxial semiconductor source and drain material 70 may be a component of the source and drain regions of the device. Source and drain regions may be present on opposing sides of the channel portion of the fin structure 10. As used herein, the term "source" is a doped region in the semiconductor device, in which majority carriers are flowing into the channel. As used herein, the term "channel" is the region underlying the gate structure, e.g., channel portion of the fin structure 10, and between the source and drain of a semiconductor device that becomes conductive when the semiconductor device is turned on. As used herein, the term "drain" means a doped region in semiconductor device located at the end of the channel, in which carriers are flowing out of the transistor through the drain.

The source and drain regions are typically doped with a conductivity type dopant that dictates the conductivity type of the device. For example, when the source and drain regions are doped to an n-type conductivity, the semiconductor device is an n-type device, such as an n-type field effect transistor (nFET), e.g., n-type FinFET. In another example, when the source and drain regions are doped to a p-type conductivity, the semiconductor device is a p-type device, such as a p-type field effect transistor (pFET), e.g., p-type FinFET.

As depicted in FIG. 9, the epitaxial source and drain material 70 is also formed atop the remaining portion of the low-k spacer material 65 that is present in the space between the split portions of the fin structures 45. The term "epitaxial" when referring the source and drain regions denotes that the semiconductor material is formed using an epitaxial deposition process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

In some embodiments, the epitaxial source and drain material 70 may be composed of a silicon containing material. For example, the epitaxial source and drain material 70 may be composed of silicon (Si). In other embodiments, the epitaxial source and drain material 70 are composed of a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as III/V and II/VI compound semiconductors. In another embodiment, the epitaxial source and drain material 70 are composed of silicon doped with phosphorus (Si:P), or silicon doped with carbon and phosphorus (SiC:P).

A number of different sources may be used for the epitaxial deposition of the epitaxial source and drain material 70. For example, a silicon including semiconductor material may be deposited from a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for germanium including semiconductor materials include germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

The dopant that dictates the conductivity type of the epitaxial source and drain material 70, which provides the source and drain regions of the device, may be implanted into the epitaxial semiconductor material that provides the epitaxial source and drain material 70 in situ. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine ($(CH_3)_3P$), dimethylphosphine ($(CH_3)_2PH$), triethylphosphine ($(CH_3CH_2)_3P$) and diethylphosphine ($(CH_3CH_2)_2PH$). The p-type gas dopant source may include diborane ($B_2H_6$).

Figure 10:
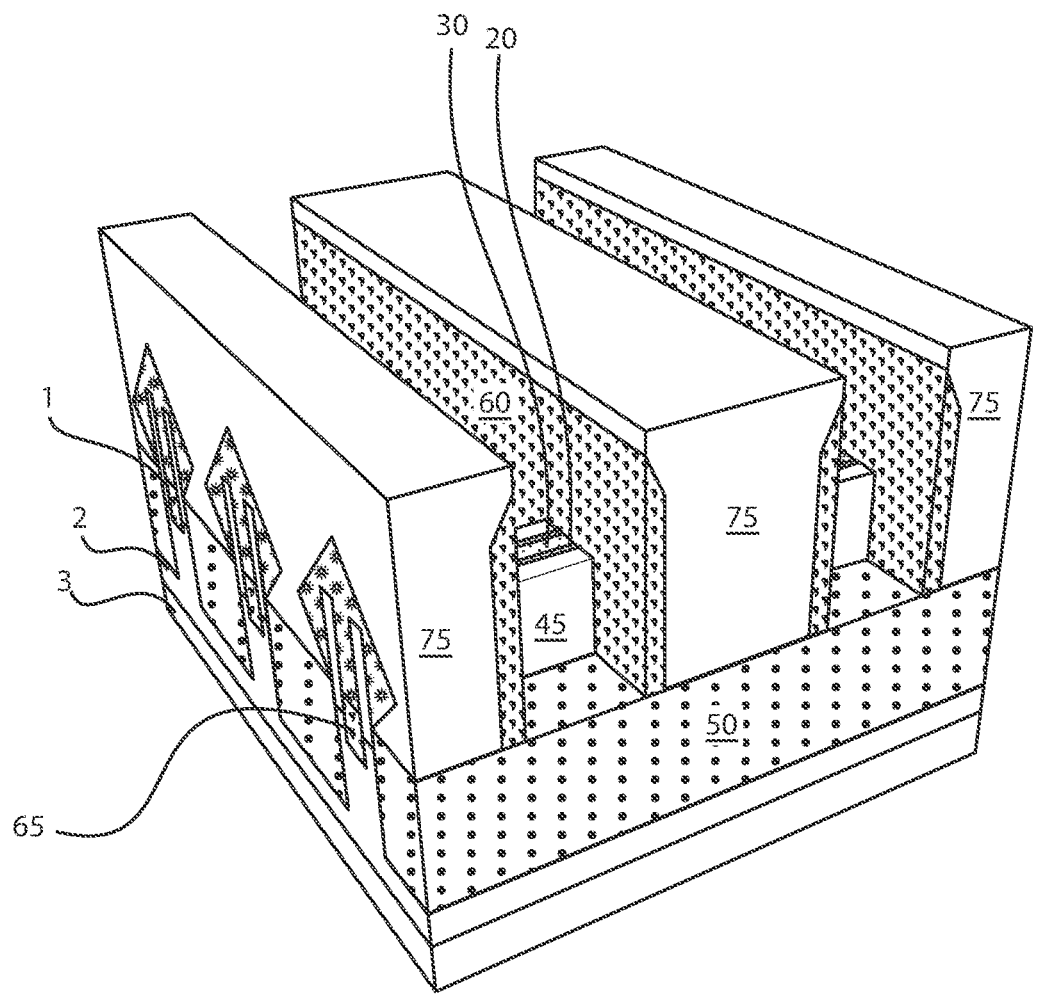
FIG. 10 is a perspective view of forming a dielectric layer over the structure depicted in FIG. 9 having an upper surface coplanar with the upper surface of the sacrificial gate structure, and removing the sacrificial gate structure, in accordance with one embodiment of the present disclosure.

FIG. 10 is a perspective view of forming an interlevel dielectric layer 75 over the structure depicted in FIG. 9 having an upper surface coplanar with the upper surface of the sacrificial gate structure 55, and removing the sacrificial gate structure 55. Removing the sacrificial gate structure 55 may begin with forming an interlevel dielectric layer 75 overlying the structure, and planarizing the interlevel dielectric layer 75 to be coplanar with an upper surface of the sacrificial gate structure 55. The sacrificial gate structure 55 may then be removed by an etch that is selective to the fin structures 45 (including the remaining portion of the metal nitride), the high-k dielectric layer 20, and the interlevel dielectric layer. Removing the sacrificial gate structure 55 provides a gate structure opening to the channel region portion of the fin structures 45. The method may continue with forming a functional gate structure 30 in the gate structure opening. The "functional gate structure" operates to switch the semiconductor device from an "on" to "off" state, and vice versa. The functional gate structure typically includes a high-k metal gate stack 80 and at least one gate conductor fill 85, as depicted in FIGS. 11A-12B.

Figure 11A:
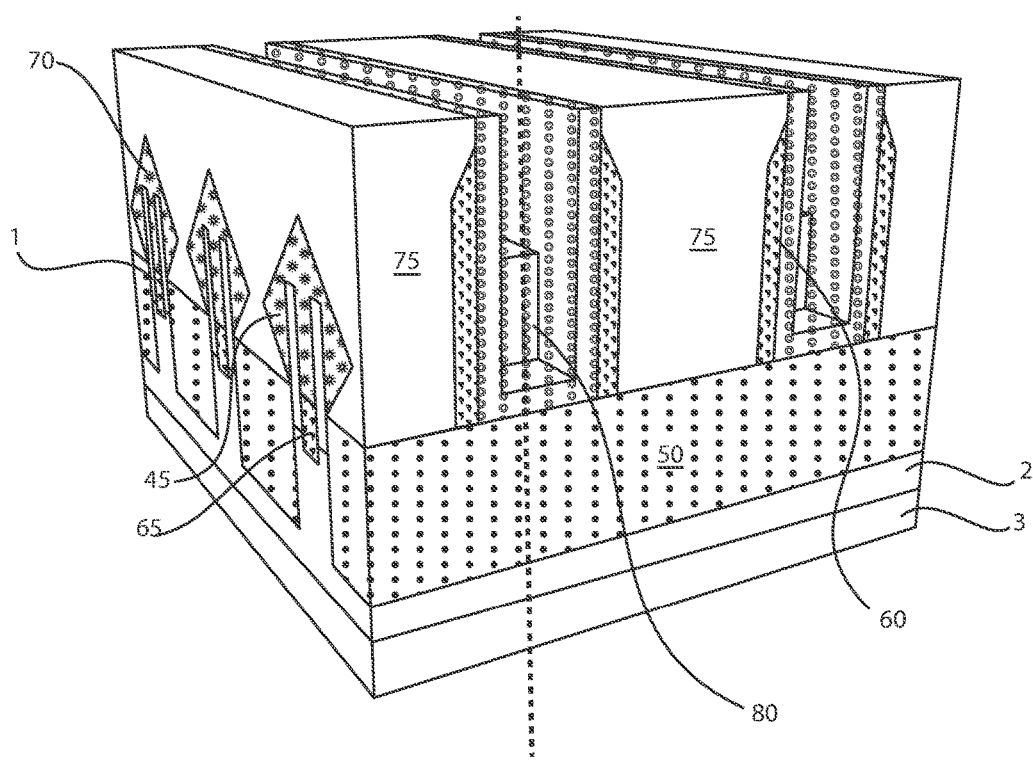
FIG. 11A is a perspective view of forming a high-k metal gate stack in the gate opening that is produced by removing the sacrificial gate structure, in accordance with one embodiment of the present disclosure.
Figure 11B:
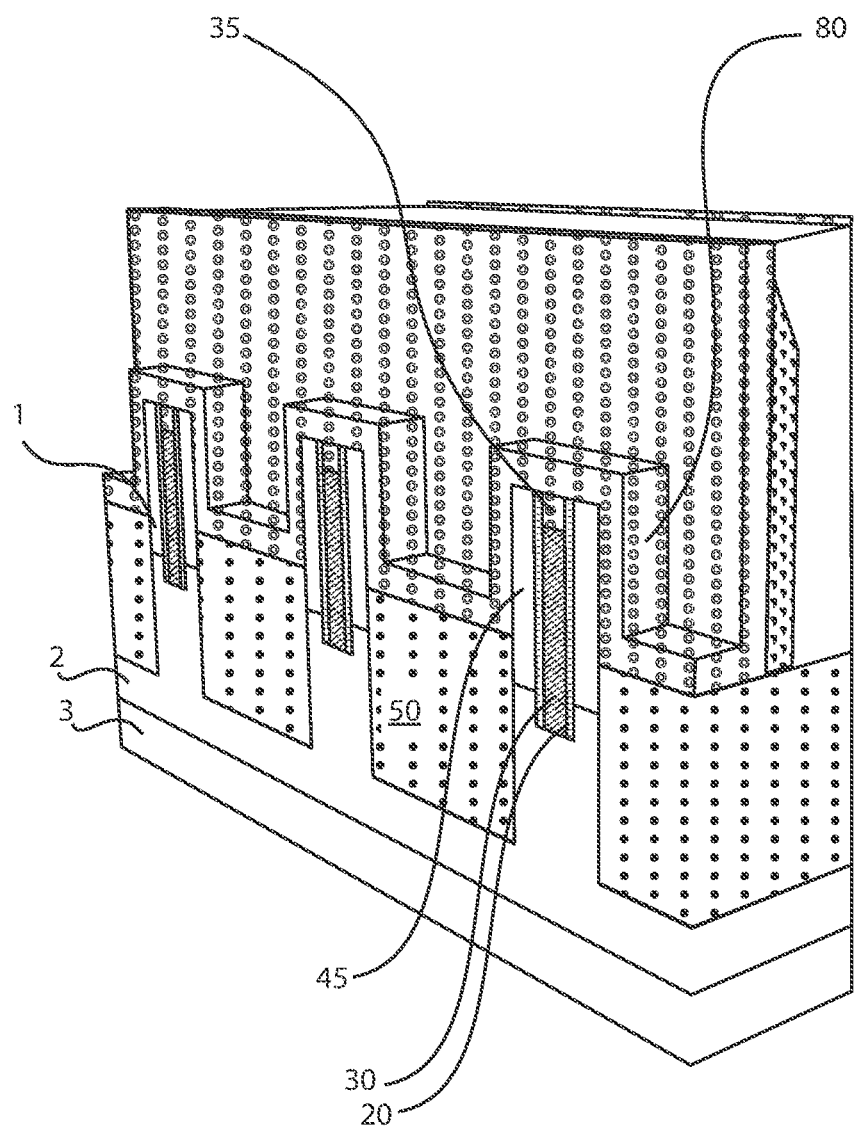
FIG. 11B is a perspective view of the cross section of the channel region of the fin structure depicted in FIG. 11A.

FIGS. 11A and 11B depict forming a high-k metal gate stack 80 in the gate opening that is produced by removing the sacrificial gate structure 55. The high-k metal gate stack 80 may include a high-k gate dielectric that is formed directly on the channel region portion of the fin structures 45, and a work function adjusting metal layer, i.e., p-type work function metal layer or n-type work function metal layer.

The term "high-k" as used to describe the material of the high-k gate dielectric of the high-k metal gate stack 80 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric has a dielectric constant greater than 7.0. In one embodiment, the high-k gate dielectric is composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the high-k gate dielectric include hafnium silicate, hafnium silicon oxynitride or combinations thereof. In one embodiment, the high-k gate dielectric may be deposited by chemical vapor deposition (CVD). Variations of CVD processes suitable for depositing the high-k gate dielectric include, but are not limited to, APCVD, LPCVD, PECVD, MOCVD, ALD, and combinations thereof. In one embodiment, the thickness of the high-k gate dielectric is greater than 0.8 nm. More typically, the high-k gate dielectric has a thickness ranging from about 1.0 nm to about 6.0 nm.

The work function adjusting metal layer is deposited on the high-k gate dielectric and may be a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In one embodiment, the n-type work function metal layer is composed of at least one of TiAl, TanN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD).

FIG. 11B is a perspective view of the cross section of the channel region of the fin structure depicted in FIG. 11A. As clearly depicted in FIG. 11B, the high-k metal gate stack 80 is present directly on a split portion of the fin structures, in which a remaining portion of the metal nitride 30 is centrally positioned in the channel region. The metal nitride 30 positioned in the channel portion of the fin structures 45 provides an electrode for enabling back bias of the FinFET. The metal nitride 30 is in contact at the bottom with dopant region 2. Dopant region 2 can be biased using the back bias contact 90 which is shown on FIG. 13. Since the dopant region 2 has a dopant concentration $2 \times 10^{18}$ cm$^{-3}$ to $1 \times 10^{19}$ cm$^3$ which is sufficiently high for the voltage across the dopant region 2 equal to the back bias applied on the back bias contact 90. As the metal nitride 30 is in contact at the bottom with dopant region 2, the metal nitride 30 should have the same voltage to the dopant region 2 which voltage is equal to the back bias contact 90. The voltage on the metal nitride 30 is the back bias voltage for the channel fin portion 45, and the voltage is uniform across the metal nitride 45 in the Y-axis thus the back bias voltage across the channel fin portion 45 is uniform. Still referring to FIG. 11B, the electrode provided by the metal nitride 30 is separated from the split fin portions 45 of the fin structures 45 by the high-k dielectric layer 20.

Figure 12A:
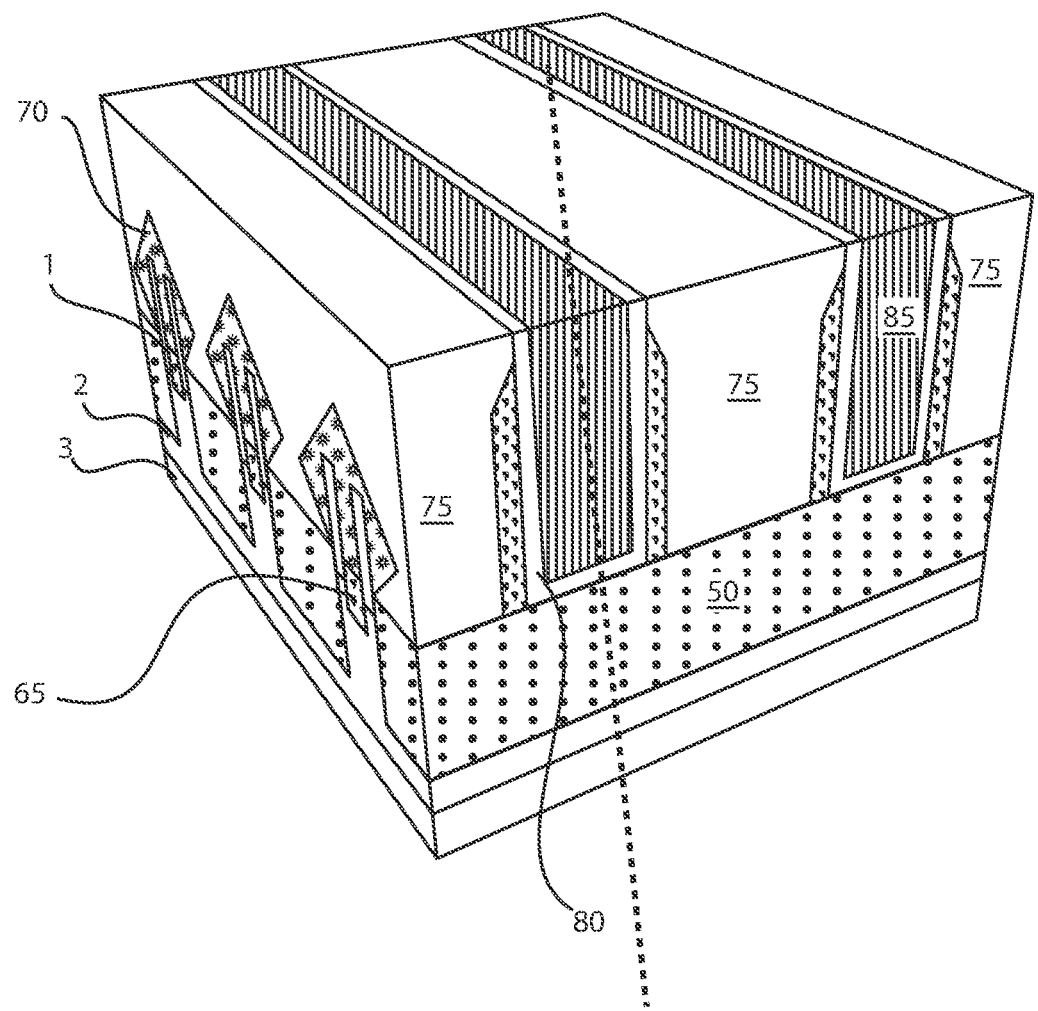
FIG. 12A is a perspective view of forming a gate material fill that fills the gate opening that is depicted in FIG. 11A, in accordance with one embodiment of the present disclosure.
Figure 12B:
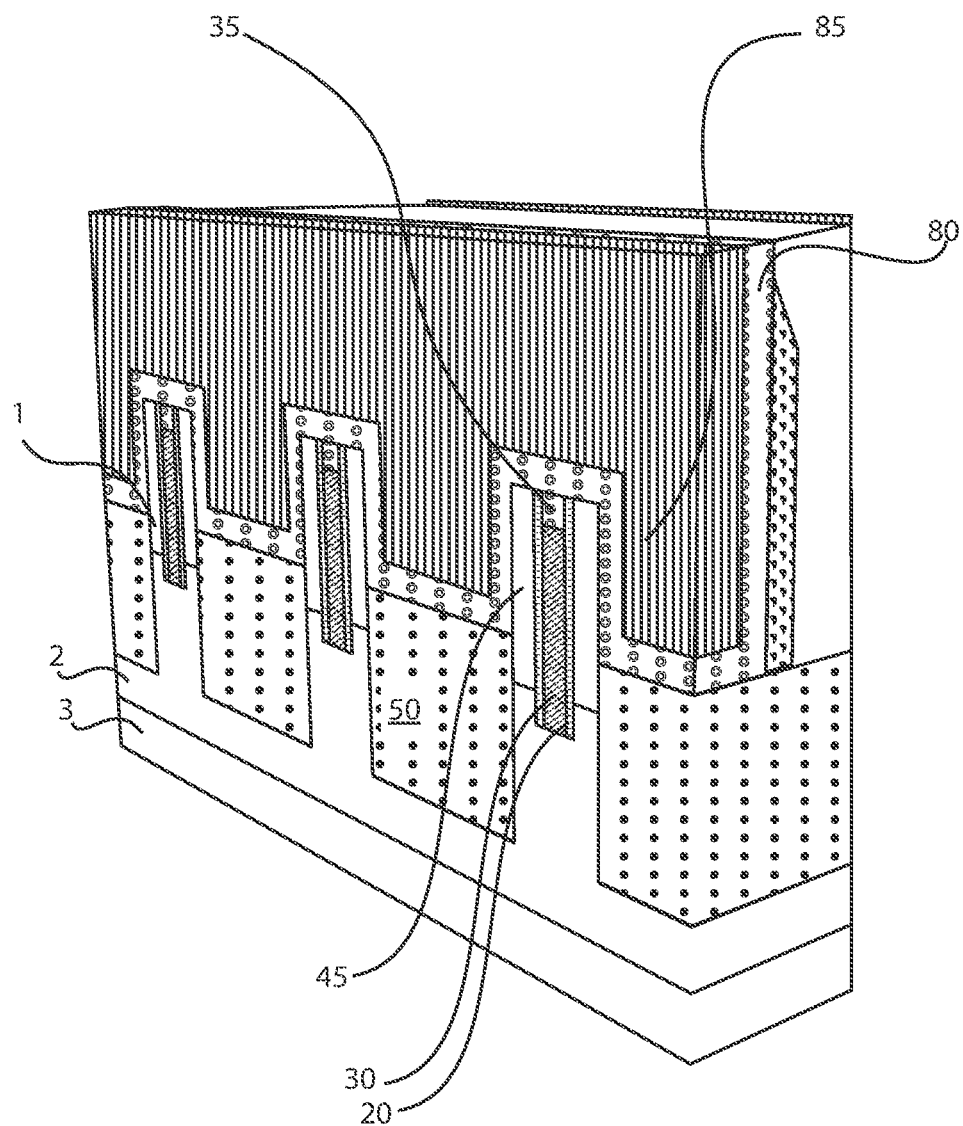
FIG. 12B is a perspective view of the cross section of the channel region of the fin structure depicted in FIG. 12A.

FIGS. 12A and 12B depict one embodiment of forming a gate material fill 85 that fills the gate opening that is depicted in FIGS. 11A and 11B. The gate material fill 85 may be composed of a metal or a doped semiconductor. The gate material fill 85 may be formed using a deposition process. In one embodiment, when the gate material fill 85 is composed of a metal, the gate material fill 85 is formed using a physical vapor deposition (PVD) process, such as sputtering. Examples of sputtering apparatus that may be suitable for depositing the gate material fill 85 include DC diode type systems, radio frequency (RF) sputtering, magnetron sputtering, and ionized metal plasma (IMP) sputtering. Metals suitable for the gate material fill 85 include tungsten (W), titanium (Ti), tantalum (Ta), copper (Cu), aluminum (Al) and alloys thereof.

Figure 13:
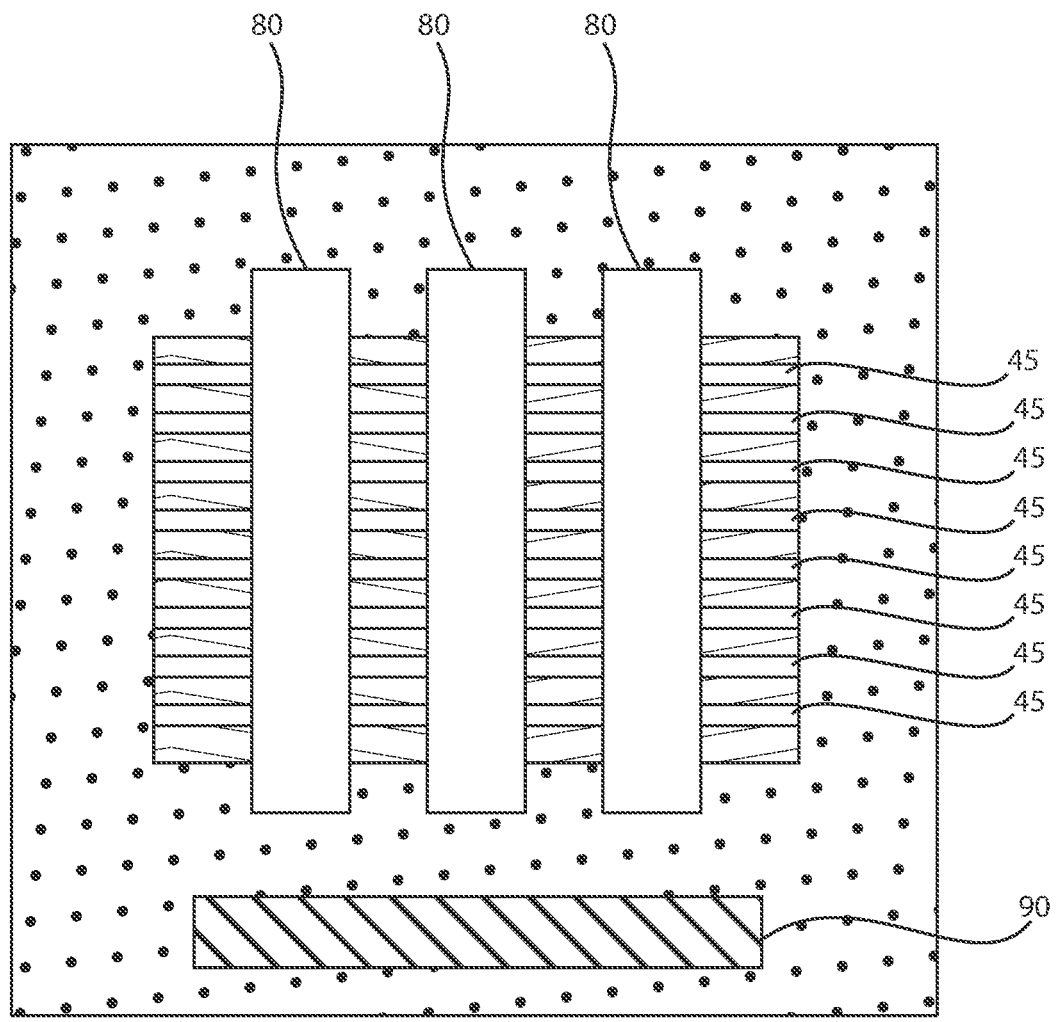
FIG. 13 is a top down view depicting of one embodiment of a semiconductor device formed in accordance with the method described with reference to FIGS. 1-12B.

FIG. 13 is a top down view depicting of one embodiment of a semiconductor device formed in accordance with the method described with reference to FIGS. 1-12B. FIG. 13 illustrates a back bias contact 90 that is in electrical communication with the metal nitride 30 positioned in the channel portion of the fin structures 45 provides an electrode for enabling back bias of the FinFET. In some embodiments, the back bias contact 90 should be deep in contact with the dopant region 2. As the dopant region 2 is across the entire active device region 95, the metal nitride 30 within the active device region 95 is in contact at the bottom with the dopant region 2. Thus the metal nitride 30 has the back bias voltage on the back contact 90.

In some embodiments, the method described above provides a semiconductor device, e.g., FinFET, that includes a metal nitride 30 present centrally within a split portion of a channel region portion of a fin structure 45 to apply a back bias to the semiconductor device. In one embodiment, the semiconductor device includes a fin structure 45 comprising a split portion, and a metal nitride 30 positioned in the split portion of a channel region of the fin structure. The semiconductor device may further include a source region 70 including a first end of the split portion of the fin structure that does not include the metal nitride; and a drain region 70 including a second end of the split portion of the fin structure that does not include the metal nitride. The first end and the second end of the split portion are on opposing sides of the channel region. A gate structure 75, 80 is present on the channel region of the fin structure. The metal nitride 30 is selected from the group consisting of titanium nitride, tantalum nitride, tungsten nitride and combinations thereof. A high-k dielectric layer 20 can be present between the metal nitride 30 and sidewalls of the fin structure 45 that are present in the split portion of the fin structure in the channel region. A dielectric cap 35 can be present between the metal nitride 30 and the gate structure 75, 80.

The methods and structures that have been described above with reference to FIGS. 1-13 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
   a fin structure comprising a split portion;
   a metal nitride positioned in the split portion of a channel region of the fin structure;
   a source region including a first end of the split portion of the fin structure that does not include the metal nitride; and
   a drain region including a second end of the split portion of the fin structure, wherein the first end and the second end of the split portion are on opposing sides of the channel region.

2. The semiconductor device of claim 1, wherein a back bias is applied to the semiconductor device using the metal nitride in the split portion of the fin structure as an electrode.

3. The semiconductor device of claim 1, wherein the metal nitride is selected from the group consisting of titanium nitride, tantalum nitride, tungsten nitride and combinations thereof.

4. The semiconductor device of claim 1, wherein a high-k dielectric layer is present between the metal nitride and sidewalls of the fin structure that are present in the split portion of the fin structure in the channel region.

5. The semiconductor device of claim 2, wherein the fin structure is present on a supporting semiconductor substrate including a doped region that is in electrical communication with the metal nitride.

6. The semiconductor device of claim 5, wherein the doped region is doped with a dopant selected from the group consisting of an n-type dopant, a p-type dopant and a combination thereof.

7. The semiconductor device of claim 6, wherein a dopant concentration for said doped region ranges from $2 \times 10^{18}$ cm$^{-3}$ to $1 \times 10^{19}$ cm$^{-3}$.

8. A semiconductor device comprising:
   a fin structure comprising a split portion;
   a metal nitride positioned in the split portion of a channel region of the fin structure, wherein a back bias is applied to the semiconductor device using the metal nitride in the split portion of the fin structure as an electrode;
   a source region including a first end of the split portion of the fin structure; and
   a drain region including a second end of the split portion of the fin structure that does not include the metal nitride, wherein the first end and the second end of the split portion are on opposing sides of the channel region.

9. The semiconductor device of claim 8, wherein the metal nitride is selected from the group consisting of titanium nitride, tantalum nitride, tungsten nitride and combinations thereof.

10. The semiconductor device of claim 8, wherein a high-k dielectric layer is present between the metal nitride and sidewalls of the fin structure that are present in the split portion of the fin structure in the channel region.

11. The semiconductor device of claim 8, wherein a dielectric cap is present between the metal nitride and a gate structure that is present on the channel region.

12. The semiconductor device of claim 8, wherein a dielectric cap is present between the metal nitride and a gate structure that is present on the channel region.

13. The semiconductor device of claim 8, wherein the fin structure is present on a supporting semiconductor substrate including a doped region that is in electrical communication with the metal nitride.

14. The semiconductor device of claim 13, wherein the doped region is doped with a dopant selected from the group consisting of an n-type dopant, a p-type dopant and a combination thereof.

15. A semiconductor device comprising:
   a fin structure comprising a split portion; and
   a metal nitride positioned in the split portion of a channel region of the fin structure, wherein a back bias is applied to the semiconductor device using the metal nitride in the split portion of the fin structure as an electrode, wherein the metal nitride does not extend to doped portions of the fin structure on opposing sides of the channel region.

16. The semiconductor device of claim 15, wherein the metal nitride is selected from the group consisting of titanium nitride, tantalum nitride, tungsten nitride and combinations thereof.

17. The semiconductor device of claim 15, wherein a high-k dielectric layer is present between the metal nitride and sidewalls of the fin structure that are present in the split portion of the fin structure in the channel region.

18. The semiconductor device of claim 17, further comprising a gate structure on the channel region of the fin structure.

19. The semiconductor device of claim 18, wherein a dielectric cap is present between the metal nitride and the gate structure.

20. The semiconductor device of claim 19, further comprising a source region and a drain region on opposing sides of the channel region of the fin structure.

* * * * *